United States Patent
Lv et al.

(10) Patent No.: US 11,880,910 B2
(45) Date of Patent: Jan. 23, 2024

(54) METHOD FOR EXTRACTING INFORMATION FROM A DISPLAY PANEL, DEVICE, AND ELECTRONIC DEVICE

(71) Applicant: Shenzhen China Star Optoelectronics Semiconductor Display Technology Co., Ltd., Shenzhen (CN)

(72) Inventors: Bo Lv, Shenzhen (CN); Zui Wang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/969,570

(22) PCT Filed: May 11, 2020

(86) PCT No.: PCT/CN2020/089547
§ 371 (c)(1),
(2) Date: Aug. 13, 2020

(87) PCT Pub. No.: WO2021/217711
PCT Pub. Date: Nov. 4, 2021

(65) Prior Publication Data
US 2023/0094380 A1    Mar. 30, 2023

(30) Foreign Application Priority Data

Apr. 27, 2020    (CN) .......................... 202010343181.3

(51) Int. Cl.
*G06F 30/398* (2020.01)
*G06T 11/00* (2006.01)
*G06F 30/10* (2020.01)

(52) U.S. Cl.
CPC .............. *G06T 11/00* (2013.01); *G06F 30/10* (2020.01); *G06F 30/398* (2020.01)

(58) Field of Classification Search
CPC .. G06F 21/79; G06F 21/86; G06F 2221/2129; G06F 1/1626; G06F 12/0866;
(Continued)

(56) References Cited

U.S. PATENT DOCUMENTS 6,841,321 B2    1/2005    Matsumoto
2017/0323279 A1*    11/2017    Dion ...................... G06Q 20/18
(Continued)

FOREIGN PATENT DOCUMENTS

CN    101866371 A    10/2010
CN    105574029 A    5/2016
(Continued)

OTHER PUBLICATIONS

International Search Report in International application No. PCT/CN2020/089547, dated Feb. 1, 2021.
(Continued)

*Primary Examiner* — Binh C Tat
(74) *Attorney, Agent, or Firm* — Nathan & Associates; Menachem Nathan (57) ABSTRACT

A method for extracting information from the display panel, a device, and an electronic device are provided. The method includes obtaining output instructions of auxiliary signs in a design drawing of the display panel, obtaining different types of default auxiliary sign specification parameters, collecting sign parameters of the auxiliary signs in the design drawing of the display panel according to the auxiliary sign specification parameters, and outputting the sign parameters of the auxiliary signs in the design drawing of the display panel.

18 Claims, 2 Drawing Sheets

(58) Field of Classification Search
CPC .... G06F 2212/2022; G06F 15/00; G06F 7/57; G06F 9/226; G06F 9/265; G06F 9/30094; G06F 9/30101; G06F 9/3885; G06F 3/048; G06F 3/147; G06F 3/0482; G06F 3/013; G06F 3/00; G06F 7/023; G06F 9/453; G06F 2203/04808; G06F 3/016; G06F 3/04845; G06F 3/0488; G06F 3/04883; G06F 16/2246; G06F 16/24575; G06F 16/29; G06F 18/24; G06F 3/011; G06F 3/015; G06F 3/0412; G06F 3/04886; G06F 1/1643; G06F 1/1647; G06F 16/9014; G06F 16/90344; G06F 17/18; G06F 2111/10; G06F 2203/04104; G06F 2203/04105; G06F 3/012; G06F 3/0219; G06F 3/0233; G06F 3/0237; G06F 3/0238; G06F 3/041; G06F 3/0414; G06F 3/0416; G06F 3/044; G06F 3/045; G06F 3/0481; G06F 3/04815; G06F 3/04817; G06F 3/04847; G06F 3/0485; G06F 30/20; G06F 8/51; G06F 9/46; G06F 9/4843; G06F 11/1438; G06F 11/1441; G06F 16/00; G06F 18/00; G06F 21/575; G06F 3/017; G06F 3/04842; G06F 30/00; G06F 30/10; G06F 30/398; G06F 9/4418; G06F 9/451; G06F 18/2178; G06F 18/217; G06F 18/21; G06F 18/25; G06F 16/2477; G06F 2218/00; G06F 2211/005; G06F 16/2379; G06F 16/24; G06F 16/245; H04N 21/466; H04N 5/262; H04N 21/44218; H04N 21/4622; G01M 13/028; G01M 13/045; G05B 19/4183; G05B 19/4184; G05B 23/0208; G05B 2219/33331
USPC .................................................. 716/110–118
See application file for complete search history.

(56) References Cited

U.S. PATENT DOCUMENTS

| | | | | |
|---|---|---|---|---|
| 2018/0336840 | A1* | 11/2018 | Niikura | ................ C09K 19/02 |
| 2018/0349543 | A1 | 12/2018 | Christo | |
| 2020/0336656 | A1* | 10/2020 | Nyallau | ................ G06N 3/045 |

FOREIGN PATENT DOCUMENTS

| | | |
|---|---|---|
| CN | 106482991 A | 3/2017 |
| CN | 110378206 A | 10/2019 |
| CN | 111046517 A | 4/2020 |
| JP | 2005241329 A | 9/2005 |
| JP | 2007200988 A | 8/2007 |
| JP | 2018156502 A | 10/2018 |
| KR | 20150010448 A | 1/2015 |
| WO | 2004088399 A1 | 10/2004 |

OTHER PUBLICATIONS

Written Opinion of the International Search Authority in International application No. PCT/CN2020/089547, dated Feb. 1, 2021.
Chinese Office Action issued in corresponding Chinese Patent Application No. 202010343181.3 dated Jan. 12, 2023, pp. 1-8.

* cited by examiner

METHOD FOR EXTRACTING INFORMATION FROM A DISPLAY PANEL, DEVICE, AND ELECTRONIC DEVICE

FIELD OF INVENTION

This disclosure relates to a field of display technology, and more particularly to a method for extracting information from a display panel, a device, and an electronic device.

BACKGROUND OF INVENTION

With the development of display technology, a liquid crystal display (LCD), an organic light emitting diode display (organic light emitting display, OLED) and other flat display devices are widely used in mobile phones, TVs, personal digital assistants, digital cameras, notebook computers, desktop computers, and other consumer electronic products due to their advantages, such as high image quality, power conservation, a thin body, and wide application ranges, and become the mainstream of display devices.

Generally, in the design process of the display panel, in order to facilitate subsequent production, a great number of signs are often set in the design process, so as to be used in different manufacturing processes.

Technical Problems

At present, after the display panel is designed, when obtaining sign information in design drawings of the display panel is needed, a designer manually records all the sign information one by one. Besides, when the design drawings are changed, it is required to manually check whether each of the sign information has been changed, which is time-consuming, labor-intensive, inefficient, and error-prone.

SUMMARY OF INVENTION

Technical Solutions

The disclosure provides a method for extracting information from the display panel, a device, and an electronic device. Sign parameters of auxiliary signs in design drawings of the display panel are collected automatically. The intelligent extraction of the sign information after the design of the display panel is realized, which eliminates manual records and manual checks. That reduces the workload of the display panel designer, and improves the working efficiency of the designer, and prevents the situation where manual recording is prone to errors.

In order to solve the above-mentioned drawback, in one aspect, the disclosure provides a method for extracting information from the display panel. The method comprises:
  obtaining output instructions of auxiliary signs in a design drawing of the display panel;
  obtaining different types of default auxiliary sign specification parameters;
  collecting sign parameters of the auxiliary signs in the design drawing of the display panel according to the auxiliary sign specification parameters; and
  outputting the sign parameters of the auxiliary signs in the design drawing of the display panel.

In some embodiments of the disclosure, the auxiliary signs in the design drawing of the display panel comprise auxiliary marks and/or auxiliary test points.

In some embodiments of the disclosure, the auxiliary signs comprise at least one type auxiliary mark, the auxiliary sign specification parameters comprise a position layer of each of the type auxiliary mark, a size of each of the type auxiliary mark, and a shape of each of the type auxiliary mark, and the sign parameters of the auxiliary signs comprise coordinates of the auxiliary marks.

The step of collecting the sign parameters of the auxiliary signs in the design drawing of the display panel according to the auxiliary sign specification parameters further comprises taking at least one type auxiliary mark as a target type auxiliary mark, determining a target position layer of the target type auxiliary mark in the design drawing of the display panel according to the auxiliary sign specification parameters, and collecting a coordinate of the target type auxiliary mark in the target position layer.

In some embodiments of the disclosure, the step of collecting the coordinate of the target type auxiliary mark in the target position layer further comprises looking for the target type auxiliary mark in the in the target position layer according to a size of the target type auxiliary mark and a shape of the target type auxiliary mark in the auxiliary sign specification parameters, to determine all of the target type auxiliary marks in the in the target position layer, and collecting the coordinate of each of the target type auxiliary marks, respectively.

In some embodiments of the disclosure, the sign parameters of auxiliary signs comprise distance-to-edge values of the auxiliary marks. The step of collecting the sign parameters of the auxiliary signs in the design drawing of the display panel according to the auxiliary sign specification parameters further comprises collecting the distance-to-edge value of each of the target type auxiliary marks, respectively.

In some embodiments of the disclosure, the sign parameters of the auxiliary signs further includes the size of the auxiliary mark and/or the shape of the auxiliary mark.

In some embodiments of the disclosure, the at least one type auxiliary mark comprises at least one of cutting alignment mark, cutting inspection mark, exposure alignment mark and metal layer positioning mark.

In some embodiments of the disclosure, the auxiliary signs comprise at least one type auxiliary test point, the auxiliary sign specification parameters comprise a position layer of each of the type auxiliary test point, a size of each of the type auxiliary test point, and a shape of each of the type auxiliary test point. The sign parameters of the auxiliary signs comprise coordinates of the auxiliary test point.

The step of collecting the sign parameters of the auxiliary signs in the design drawing of the display panel according to the auxiliary sign specification parameters further comprises taking the at least one type auxiliary test point as a target type auxiliary test point, determining the position layer of the target type auxiliary test point in the design drawing of the display panel according to the auxiliary sign specification parameters, and collecting a coordinate of the target type auxiliary test point in the position layer of the target type auxiliary test point.

In some embodiments of the disclosure, the display panel is an organic light emitting diode display panel.

In some embodiments of the disclosure, The method further comprises recollecting the sign parameters of the auxiliary sign in the updated design drawing of the display panel, when the design drawing of the display panel is updated, according to the auxiliary sign specification parameters, and outputting the sign parameters of the auxiliary signs in the design drawing of the display panel.

In another aspect, the disclosure further provides a device for extracting information from a display panel. The device comprises:

a first obtaining module for obtaining output instructions of auxiliary signs in a design drawing of the display panel;

a second obtaining module for obtaining different types of default auxiliary sign specification parameters;

an acquisition module for collecting sign parameters of the auxiliary signs in the design drawing of the display panel according to the auxiliary sign specification parameters; and an output module for outputting the sign parameters of the auxiliary signs in the design drawing of the display panel.

In some embodiments of the disclosure, the auxiliary signs in the design drawing of the display panel comprise auxiliary marks and/or auxiliary test points.

In some embodiments of the disclosure, the auxiliary signs comprise at least one type auxiliary mark, the auxiliary sign specification parameters comprise a position layer of each of the type auxiliary mark, a size of each of the type auxiliary mark, and a shape of each of the type auxiliary mark, and the sign parameters of the auxiliary signs comprise coordinates of the auxiliary marks.

the acquisition module is configured for taking at least one type auxiliary mark as a target type auxiliary mark, determining a target position layer of the target type auxiliary mark in the design drawing of the display panel according to the auxiliary sign specification parameters, and collecting a coordinate of the target type auxiliary mark in the target position layer.

In some embodiments of the disclosure, the acquisition module is configured for looking for the target type auxiliary mark in the in the target position layer according to a size of the target type auxiliary mark and a shape of the target type auxiliary mark in the auxiliary sign specification parameters, to determine all of the target type auxiliary marks in the in the target position layer, and collecting the coordinate of each of the target type auxiliary marks, respectively.

In some embodiments of the disclosure, the sign parameters of auxiliary signs comprise distance-to-edge values of the auxiliary marks.

The acquisition module is further configured for collecting the distance-to-edge values of each of the target type auxiliary marks, respectively.

In some embodiments of the disclosure, the at least one type auxiliary mark comprises at least one of cutting alignment mark, cutting inspection mark, exposure alignment mark and metal layer positioning mark.

In some embodiments of the disclosure, the sign parameters of the auxiliary signs further includes the size of the auxiliary mark and/or the shape of the auxiliary mark.

In some embodiments of the disclosure, the auxiliary signs comprise at least one type auxiliary test point, the auxiliary sign specification parameters comprise a position layer of each of the type auxiliary test point, a size of each of type the auxiliary test point, and a shape of each of the type auxiliary test point. The sign parameters of the auxiliary signs comprise coordinates of the auxiliary test point.

The acquisition module is configured for taking the at least one type auxiliary test point as a target type auxiliary test point, determining a position layer of the target type auxiliary test point in the design drawing of the display panel according to the auxiliary sign specification parameters, and collecting a coordinate of the target type auxiliary test point in the position layer of the target type auxiliary test point.

In some embodiments of the disclosure, the display panel is an organic light emitting diode display panel.

In some embodiments of the disclosure, the display panel is a thin film transistor liquid crystal display panel.

In some embodiments of the disclosure, the acquisition module is configured for recollecting the sign parameters of the auxiliary sign in the updated design drawing of the display panel, when the design drawing of the display panel is updated, according to the auxiliary sign specification parameters.

The output module is further configured for outputting the sign parameters of the auxiliary signs in the design drawing of the display panel.

In another aspect, the disclosure further provides an electronic device. The electronic device comprises one or more processors; a storage element; and one or more applications, wherein the one or more applications are stored in the storage element and configured to be executed by the processor to implement the method for extracting information from a display panel.

Advantageous Effects

Advantageous effects of the disclosure are as follows. In this disclosure, by directly obtaining the output instructions of the auxiliary signs in the design drawing of the display panel, and automatically collecting the sign parameters of the auxiliary signs in the design drawing of the display panel according to the default auxiliary sign specification parameters, the intelligent extraction of the sign information after the design of the display panel is realized. There is no need for manual recording and manual inspection, which reduces the workload of the designer of the display panel, improves the designer's work efficiency, and prevents the situation where manual recording is prone to errors.

DESCRIPTION OF DRAWINGS

In order to more clearly illustrate the embodiments of the disclosure or the technical solutions in the prior art, the following briefly introduces the accompanying drawings used in the embodiments. Obviously, the drawings in the following description merely show some of the embodiments of the disclosure. As regards one of ordinary skill in the art, other drawings can be obtained in accordance with these accompanying drawings without making creative efforts.

DETAILED DESCRIPTION OF PREFERRED EMBODIMENTS

The technical solutions in the embodiments of the disclosure will be described clearly and completely below with reference to the drawings in the embodiments of the disclosure. Obviously, the described embodiments are only a part of the embodiments of the disclosure, but not all the embodiments. Based on the embodiments in the disclosure, all other embodiments obtained by those skilled in the art without creative efforts fall within the scope of the disclosure.

In the description of this disclosure, it should be understood that the terms "center", "longitudinal", "transverse", "length", "width", "thickness", "upper", "lower", "front", "back, "left", "right", "vertical", "horizontal", "top", "bottom", "inner", "outer" etc. for indicating orientation or positional relationship are based on the orientation or positional relationship shown in the drawings. The above-mentioned terms are only for the convenience of describing the disclosure and for simplifying the description, rather than indicating or implying that the device or element referred to must have a specific orientation, be constructed and operated in a specific orientation. Therefore, it cannot be understood as a limitation to this disclosure. In addition, the terms "first" and "second" are used for description purposes only, and cannot be understood as indicating or implying relative importance or implicitly indicating the disclosed number of technical features. Thus, features defined as "first" and "second" may explicitly or implicitly include one or more of the features. In the description of this disclosure, the meaning of "plurality" is two or more, unless otherwise specifically limited.

In this disclosure, the term "exemplary" is used to mean "used as an example, illustration, or description." Any embodiment described as "exemplary" in this disclosure is not necessarily to be construed as more preferred or advantageous than other embodiments. In order to enable any person skilled in the art to implement and use this disclosure, the following description is provided. In the following description, details are described for explanatory purposes. It should be understood that those of ordinary skill in the art may recognize that the disclosure can be implemented without using these specific details. In other examples, well-known structures and processes will not be elaborated in detail in order to avoid unnecessary details that obscure the description of the disclosure. Therefore, this disclosure is not intended to be limited to the illustrated embodiments, but is consistent with the widest scope consistent with the principles and features disclosed in this disclosure.

Embodiments of the disclosure provide a method for extracting information from a display panel, a device, and an electronic device, which will be described in detail below.

First, the method for extracting information from a display panel in the embodiment of the disclosure is described. The method for extracting information from the display panel is executed in an electronic device. The electronic device is a desktop terminal or a mobile terminal, and the electronic device may specifically be one of a mobile phone, a tablet, and a notebook.

Figure 1:
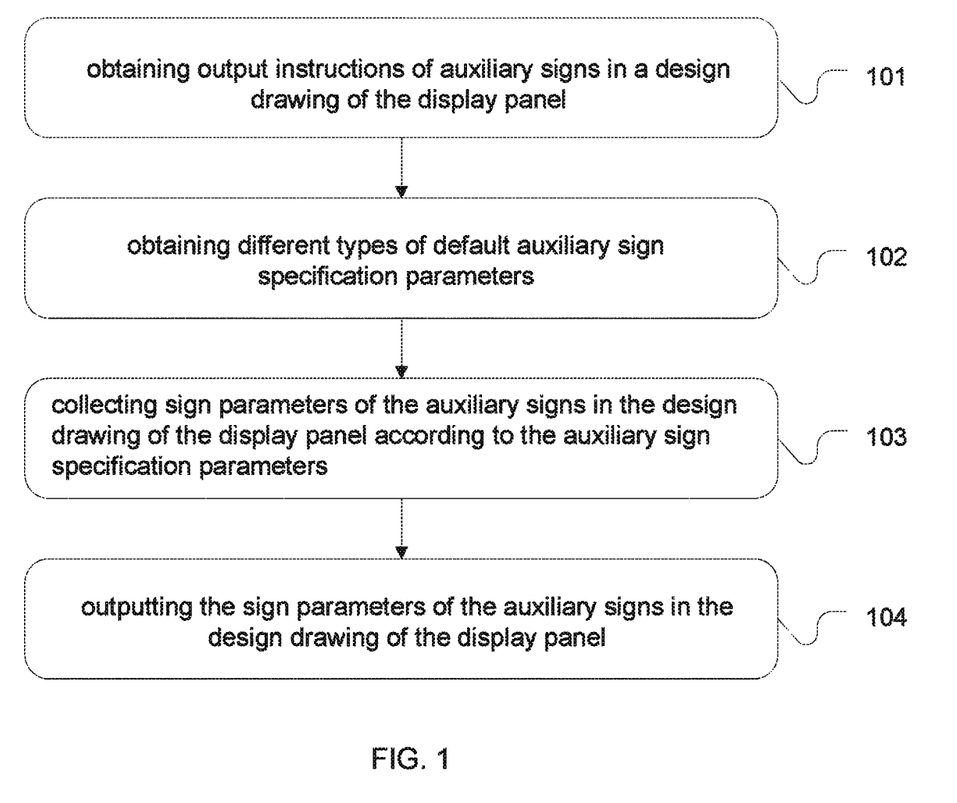
FIG. 1 is a schematic flowchart of a method for extracting information from a display panel according to an embodiment of the disclosure.

Referring to FIG. 1, a schematic flowchart of a method for extracting information from a display panel according to an embodiment of the disclosure is shown. The method comprises:

a step101: obtaining output instructions of auxiliary signs in a design drawing of the display panel;

a step102: obtaining different types of default auxiliary sign specification parameters;

a step103: collecting sign parameters of the auxiliary signs in the design drawing of the display panel according to the auxiliary sign specification parameters; and a step104: outputting the sign parameters of the auxiliary signs in the design drawing of the display panel.

In this embodiment of the disclosure, by directly obtaining the output instructions of the auxiliary signs in the design drawing of the display panel, and automatically collecting the sign parameters of the auxiliary signs in the design drawing of the display panel according to the default auxiliary sign specification parameters, the intelligent extraction of the sign information after the design of the display panel is realized. There is no need for manual recording and manual inspection, which reduces the workload of the designer of the display panel, improves the designer's work efficiency, and prevents the situation where manual recording is prone to errors.

In the embodiment of the disclosure, the execution process of the method for extracting information from the display panel can be loaded in a display panel design program in the form of plug-ins, or it can be a display panel inspection program being independent of the display panel design program. As long as the design parameters of the display panel corresponding to the user's current operation design can be collected in the display panel design program, the design parameters are not limited herein.

Moreover, the display panel design program can be the conventional electronic design automation (EDA) program for display panel design, such as Protel, Altium designer, PSpice, OrCAD, etc.

In some embodiments of this disclosure, the sign parameters of the auxiliary signs in the design drawing of the display panel can be collected through a transfer interface. For example, a transfer interface can be pre-defined in a plug-in corresponding to the method for extracting information from the display panel or an information extraction program of the display panel, and the sign parameters of auxiliary signs in the design drawing of the display panel can be collected in the display panel design program. Certainly, the method for extracting information from the display panel can also be a new function device or module designed in the EDA program.

In the embodiment of the disclosure, the step of obtaining the output instructions of auxiliary signs in the design drawing of the display panel comprises that the user operates the function of outputting the auxiliary signs in the design drawing of the display panel in the plug-in corresponding to the method for extracting information from the display panel or the information extraction program of the display panel to obtain the output instructions of the auxiliary signs in the design drawing of the display panel. For example, when an item of "outputting auxiliary signs in the design drawing of display panel" in a menu in the plug-in corresponding to the method for extracting information from the display panel or the information extraction program of the display panel is set, and the user clicks the item of "outputting auxiliary signs in the design drawing of the display panel", the output instructions of auxiliary signs in the design drawing of the display panel is obtained.

It should be noted that the auxiliary signs in the design drawing of the display panel are the signs added in the design process of the display panel for the convenience of subsequent production. The auxiliary signs in the design drawing of the display panel include auxiliary marks (mark) and/or auxiliary test points (testkey). It can be understood that the auxiliary signs in the design drawings of the display panel can also include other auxiliary signs other than the auxiliary marks and the auxiliary test points (testkey). Signs related to other auxiliary functions in the design drawing of the display panel can be used, which is not limited here.

Since the auxiliary marks are generally distinguished according to functions, positions, sizes or shapes in the design drawing of the display panel, multiple types of auxiliary marks can be included. The function taken as an example is described as follow.

In the field of liquid crystal display manufacturing, manufacturing a liquid crystal display panel usually includes the following processes: first, a thin film transistor array substrate is made for a liquid crystal display panel and a color filter array substrate for a liquid crystal display panel, and then the thin film transistor array substrate and color filter array substrate are aligned and assembled. After they are assembled, the assembled thin film transistor array substrate and the color filter array substrate need to be cut to form a liquid crystal display panel. Before aligning the thin film transistor array substrate and the color filter substrate, a cutting alignment mark and a cutting inspection mark are usually provided on the thin film transistor array substrate and the color filter array substrate. According to the position information of the cutting alignment mark, the assembled substrate for the liquid crystal display panel is accurately disposed in a cutting device, and then the cutting is performed. Finally, the accuracy of the cutting is checked according to the cutting inspection mark. Besides, in the embodiment of the disclosure, the auxiliary marks in the design drawing of the display panel include cutting alignment marks and cutting inspection marks.

For another example, an exposure machine is required during the low-temperature polysilicon manufacturing process of the display panel. After the display panel enters the exposure machine, it needs to perform an exposure alignment (alignment) first, and then perform exposure after the exposure alignment is completed. Therefore, in the design process of the display panel, an exposure alignment mark is disposed. Currently, the display panel is usually manufactured by a 14-layers film process. Therefore, the exposure alignment mark of the display panel is usually disposed on an alignment layer. The alignment layer mainly comprises a light-shielding (LS) layer, an active layer and a second metal layer. Due to the size of the exposure alignment mark on the display panel, the display panel needs to be aligned multiple times, so that there are multiple sets of exposure alignment marks symmetrically disposed on both sides of the display panel. Therefore, in the embodiment of the disclosure, the auxiliary marks in the design drawing of the display panel include an exposure alignment mark.

In the process of forming a multi-layer metal layer in the display panel, a metal layer positioning mark can be disposed in a non-working area of the metal layer (the non-working area here refers to a metal layer area without any circuit). The metal layer positioning mark is configured for positioning and aligning for the subsequently formed metal layer. Therefore, in the embodiment of the disclosure, the auxiliary marks in the design drawing of the display panel include a metal layer positioning mark.

As mentioned above, the design drawing of the display panel includes the cutting alignment mark, the cutting inspection mark, the exposure alignment mark and the metal layer positioning mark.

It should be noted that the above embodiments of the types of the auxiliary marks are classified by different function types. It can be understood that the types of auxiliary marks can also be classified into different types according to the size of auxiliary marks or the shape of auxiliary marks, and is not limited herein.

Since each different type of the auxiliary signs comprises different functions, it further comprises different auxiliary sign specification parameters, such as sizes of the auxiliary signs, shapes of the auxiliary signs, and a layer where the auxiliary signs are located, etc. In the embodiment of the disclosure, the auxiliary sign specification parameters can be preset, so that the auxiliary sign specification parameters corresponding to various types of auxiliary signs can be directly used to search for the preset auxiliary signs in the design drawing of the display panel.

Figure 2:
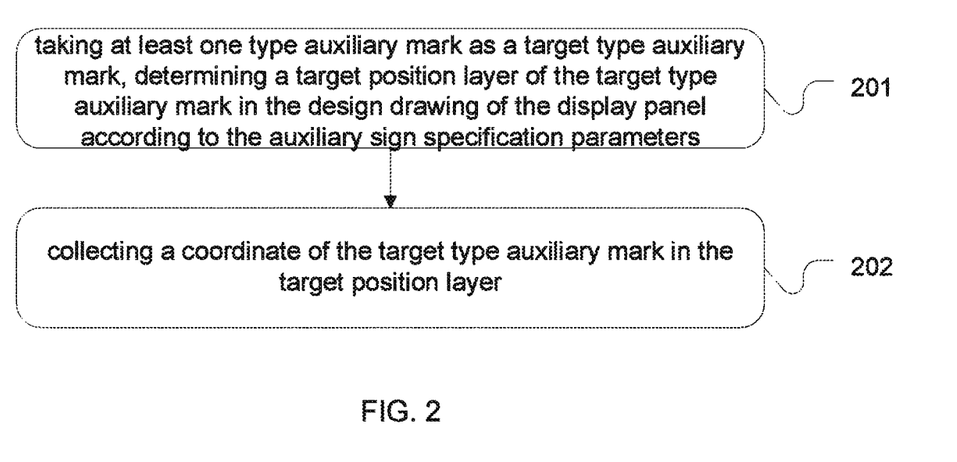
FIG. 2 is a schematic flowchart of an embodiment of step 103 provided in an embodiment of the disclosure.

In some specific embodiments, when the auxiliary signs comprise the auxiliary marks, the auxiliary signs include at least one type of auxiliary mark. At this time, the auxiliary sign specification parameter includes an auxiliary mark specification parameter, the auxiliary mark specification parameter includes a position layer of each type of the auxiliary mark, a size of each type of auxiliary mark, and a shape of each type of auxiliary mark. The sign parameters of the auxiliary signs comprise coordinates of the auxiliary marks. Referring to FIG. 2, in step 103, according to the auxiliary sign specification parameters, the sign parameters of the auxiliary sign in the design drawing of the display panel are collected. The step further includes sub-steps as follow.

In a step 201, at least one type auxiliary mark is configured as a target type auxiliary mark, a target position layer of the target type auxiliary mark in the design drawing of the display panel is determined according to the auxiliary sign specification parameters.

As mentioned above, when the auxiliary mark is designed, each of type auxiliary sign specification parameters of at least one type auxiliary marks is set in the auxiliary sign specification parameters. Therefore, the target position layer of the target type auxiliary mark can be determined in the design drawing of the display panel according to specifications of each type of auxiliary mark. For example, the exposure alignment mark of the display panel is usually disposed on the alignment layer. The alignment layer of the display panel mainly comprises a light-shielding (LS) layer, an active layer and a second metal layer. The exposure alignment mark can be found in the alignment layer.

In a step 202, a coordinate of the target type auxiliary mark is collected in the target position layer.

After determining the target position layer of the target type auxiliary mark, the coordinate of the target type auxiliary mark is collected in the target position layer. Specifically, the step of collecting the coordinate of the target type auxiliary mark in the target position layer further comprises: looking for the target type auxiliary mark in the target position layer according to a size of the target type auxiliary mark and a shape of the target type auxiliary mark in the auxiliary sign specification parameters, determining all of the target type auxiliary marks in the target position layer, and collecting the coordinate of each of the target type auxiliary marks, respectively.

The exposure alignment mark is taken as an example. It is assumed that the size of the exposure alignment mark in a exposure alignment mark specification is a (a is a positive number) and the shape is circular. Then according to the exposure alignment mark specification, the exposure alignment mark can be found in the alignment layer. All of the exposure alignment marks are determined, and then the coordinates of each of the target type auxiliary marks are collected respectively.

It should be noted that in the embodiments of the disclosure, the coordinate system will be pre-defined in advance. Referring to the common specifications in this field, a center of the display panel (which can be a center of the PCB board in the display panel) is generally taken as a coordinate origin. Therefore, after determining all the target type auxiliary marks in the target position layer, the coordinates of each of the target type auxiliary marks can be collected according to the preset coordinate system.

Usually, in the subsequent production of the display panel, there will be more requirements for parameters of the auxiliary marks. Therefore, when the auxiliary signs comprise the auxiliary marks, the auxiliary sign specification parameters also include more parameter information of the auxiliary marks. For example, the auxiliary sign specification parameters included in the sign parameters of auxiliary signs further comprise distance-to-edge values of the auxiliary marks. The distance-to-edge values are the distances between the auxiliary marks and one or more edges in the display panel, or the distances between the auxiliary marks and a preset target object. The target object is a preset type object in the design drawing of the display panel, such as a metal layer, etc. At this time, the step of collecting the sign parameters of the auxiliary signs in the design drawings of the display panel according to the auxiliary sign specification parameters further comprises: collecting the distance-to-edge value of each of the target type auxiliary marks, respectively. Similarly, since the coordinate system is preset, after determining all the target type auxiliary marks in the target position layer, the distance-to-edge values of each of the target type auxiliary marks can be collected, respectively.

In some embodiments of the disclosure, the sign parameters of the auxiliary signs further includes the size of the auxiliary mark and/or the shape of the auxiliary mark. That is, the sign parameters of the auxiliary signs output in step 104 further includes the size of the auxiliary mark and/or the shape of the auxiliary mark, so that the output sign parameters of the auxiliary signs may include more information of the auxiliary sign. The size of the auxiliary mark and the shape of the auxiliary mark are preset in the auxiliary sign specification parameters. Therefore, when determining all the target type auxiliary marks in the target position layer in the later stage, the size of the auxiliary mark and/or the shape of the auxiliary mark may be directly output.

Generally, the display panel is tested by testkey before leaving the factory. Therefore, at the beginning of the design of the display panel, some special auxiliary test points (testkey) for testing various types of auxiliary test points is pre-designed on the display panel. The testkey has nothing to do with the function of the display panel itself. The function of the testkey is to detect whether there is any change in the manufacturing process of the display panel. When the auxiliary sign includes a testkey, the auxiliary sign includes at least one type auxiliary test point. The auxiliary sign specification parameters comprise a position layer of each type of the auxiliary test point, a size of each type of the auxiliary test point, and a shape of each type the auxiliary test point, and the sign parameters of the auxiliary signs comprise coordinates of the auxiliary test point.

Meanwhile, the step of collecting the sign parameters of the auxiliary signs in the design drawings of the display panel according to the auxiliary sign specification parameters further comprises: taking the at least one type of the auxiliary test point as a target type auxiliary test point, determining a position layer of the target type auxiliary test point in the design drawing of the display panel according to the auxiliary sign specification parameters, and collecting a coordinate of the target type auxiliary test point in the target position layer of the target type auxiliary test point.

In this embodiment of the disclosure, the position layer of the target type auxiliary test point in the design drawing of the display panel is determined according to the auxiliary sign specification parameters. A coordinate of the target type auxiliary test point is collected in the position layer of the target type auxiliary test point. That is similar to the steps of determining the target position layer of the target type auxiliary mark in the design drawing of the display panel according to the auxiliary sign specification parameters, and collecting a coordinate of the target type auxiliary mark in the target position layer of the target type auxiliary test point in the above embodiment, and is not repeated here.

It should be noted that the display panel in the embodiment of the application can be various types of display panels, such as a liquid crystal display (LCD) panel, an organic light emitting diode (OLED) display panel, etc., specifically, such as a thin film transistor liquid crystal display (TFT-LCD), etc.

As the display panel technology has been improving, the design specifications of the display panel have been updated. Therefore, due to process improvement and design optimization, if the design specifications are updated, different types of auxiliary signs specification parameters preset in the display panel can be updated simultaneously. Specifically, in some embodiments of the disclosure, the method for extracting information from the display panel further includes: obtaining new auxiliary signs specification parameters of the display panel. The new auxiliary signs specification parameters comprise a specification parameter of at least one type auxiliary sign. Based on the new auxiliary signs specification parameters, the auxiliary signs specification parameters are updated. Later, based on the updated auxiliary signs specification parameters, after obtaining a new output instruction of auxiliary sign in a design drawing of the display panel, sign parameters of the auxiliary signs are collected in the design drawing of the display panel according to the updated auxiliary sign specification parameters. The sign parameters of the auxiliary signs in the design drawing of the display panel are output.

In the embodiment of the disclosure, there are multiple methods of outputting the sign parameters of the auxiliary signs in the design drawing of the display panel. In one embodiment, the sign parameters of the auxiliary signs in the design drawing of the display panel are output in the form of Excel, and the details are shown in Table 1 below:

TABLE 1

| auxiliary signs | size | shape | position | coordinate |
|---|---|---|---|---|
| auxiliary mark 1 | a | circular | position layer 1 | (x1, y1) |
| auxiliary mark 2 | b | square | position layer 2 | (x2, y2) |
| auxiliary test point 1 | c | circular | position layer 3 | (x3, y3) |

In Table 1, a, b and c are positive numbers, and the parameters in the table are only examples, which are not limited in practical application.

It can be understood that in the embodiment of the application, the method of outputting the sign parameters of the auxiliary signs in the design drawing of the display panel further comprises outputting the sign parameters of the auxiliary signs in the design drawing of the display panel in the form of PDF files with tables or word files and other text formats, which are not limited here.

Figure 3:
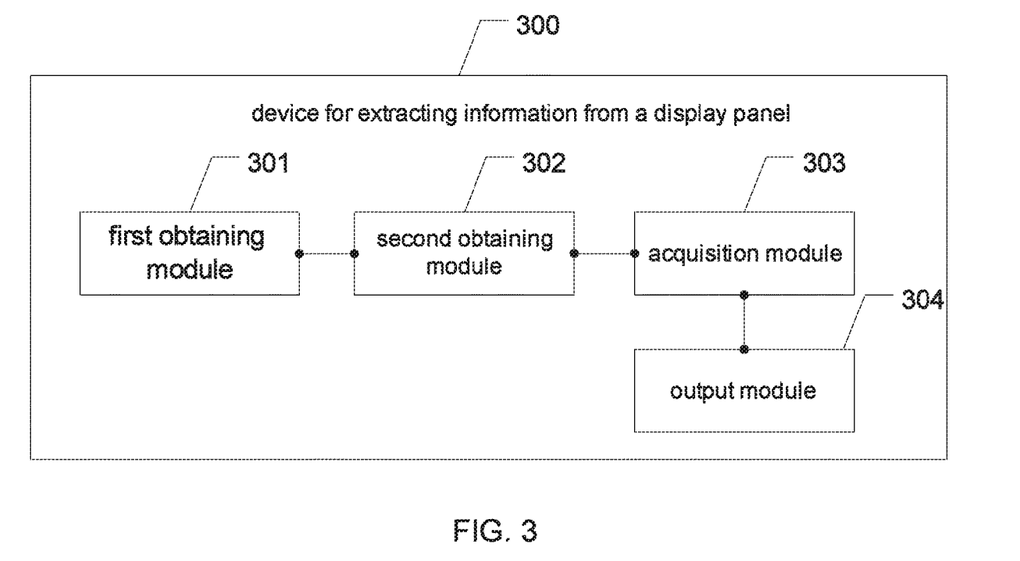
FIG. 3 is a schematic flowchart of an embodiment of an device for extracting information from a display panel according to an embodiment of the disclosure.

In order to better implement the method for extracting information from the display panel in the embodiment of the application, based on the method for extracting information from the display panel, an embodiment of the disclosure further provides a device for extracting information from a display panel. As shown in FIG. 3, the device 300 for extracting information from a display panel includes:

a first obtaining module 301 for obtaining output instructions of auxiliary signs in a design drawing of the display panel;

a second obtaining module 302 for obtaining different types of default auxiliary sign specification parameters;

an acquisition module 303 for collecting sign parameters of the auxiliary signs in the design drawing of the display panel according to the auxiliary sign specification parameters; and an output module 304 for outputting the sign parameters of the auxiliary signs in the design drawing of the display panel.

In the embodiment of the disclosure, the device 300 for extracting information from a display panel can automatically collect the sign parameters of the auxiliary signs in the design drawing of the display panel according to the default auxiliary sign specification parameters by directly obtaining the output instructions of the auxiliary signs in the design drawing of the display panel. The intelligent extraction of the sign information after the design of the display panel is realized. There is no need for manual recording and manual inspection, which reduces the workload of the designer of the display panel, improves the designer's work efficiency, and prevents the situation where manual recording is prone to errors.

In some embodiments of the disclosure, the auxiliary signs comprise at least one type auxiliary mark, the auxiliary sign specification parameters comprise a position layer of each of the type auxiliary mark, a size of each of the type auxiliary mark, and a shape of each of the type auxiliary mark, and the sign parameters of the auxiliary signs comprise coordinates of the auxiliary marks.

The acquisition module 303 is configured for:
taking at least one type auxiliary mark as a target type auxiliary mark, determining a target position layer of the target type auxiliary mark in the design drawing of the display panel according to the auxiliary sign specification parameters; and collecting a coordinate of the target type auxiliary mark in the target position layer.

In some embodiments of the disclosure, the acquisition module 303 is configured for:
looking for the target type auxiliary mark in the in the target position layer according to a size of the target type auxiliary mark and a shape of the target type auxiliary mark in the auxiliary sign specification parameters, to determine all of the target type auxiliary marks in the in the target position layer; and collecting the coordinate of each of the target type auxiliary marks, respectively.

In some embodiments of the disclosure, the sign parameters of auxiliary signs comprise distance-to-edge values of the auxiliary marks, and the acquisition module 303 is further configured for:
collecting the distance-to-edge values of each of the target type auxiliary marks, respectively.

In some embodiments of the disclosure, the sign parameters of the auxiliary signs further include the size of the auxiliary mark and/or the shape of the auxiliary mark.

In some embodiments of the disclosure, the auxiliary signs comprise at least one type auxiliary test point, the auxiliary sign specification parameters comprise a position layer of each of the type auxiliary test point, a size of each of type the auxiliary test point, and a shape of each of the type auxiliary test point. The sign parameters of the auxiliary signs comprise coordinates of the auxiliary test point.

Specifically, the acquisition module 303 is configured for:
taking the at least one type auxiliary test point as a target type auxiliary test point, determining a position layer of the target type auxiliary test point in the design drawing of the display panel according to the auxiliary sign specification parameters; and collecting a coordinate of the target type auxiliary test point in the position layer of the target type auxiliary test point.

In some embodiments of the disclosure, the acquisition module is further configured for recollecting the sign parameters of the auxiliary sign in the updated design drawing of the display panel, when the design drawing of the display panel is updated, according to the auxiliary sign specification parameters.

The output module is further configured for outputting the sign parameters of the auxiliary signs in the design drawing of the display panel.

An embodiment of the disclosure also provides an electronic device that integrates any device for extracting information from a display panel provided by an embodiment of the disclosure. The electronic device includes:
one or more processors;
a storage element; and
one or more applications.

The one or more applications are stored in the storage element and configured to be executed by the processor to implement the steps in the method for extracting information from a display panel described in any of the above embodiments according to the above embodiments of the method for extracting information from a display panel.

Figure 4:
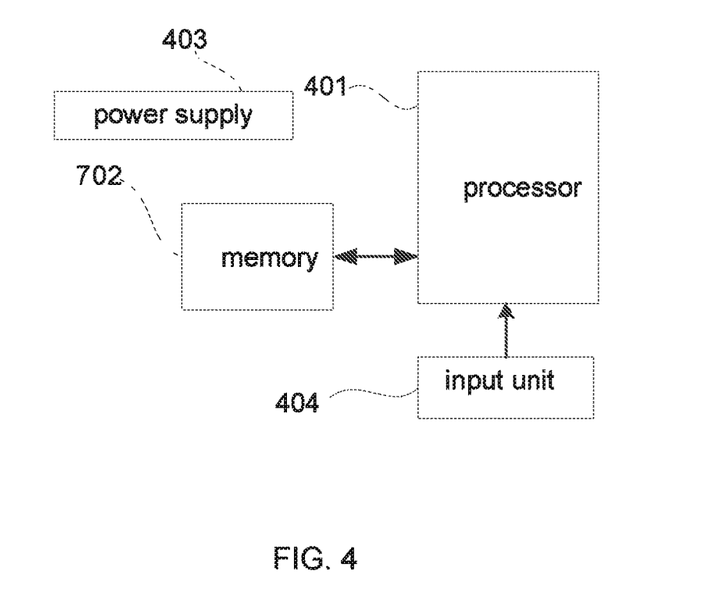
FIG. 4 is a schematic flowchart of an embodiment of an electronic device provided by an embodiment of the disclosure.

An embodiment of the disclosure also provides an electronic device that integrates any device for extracting information from a display panel provided by an embodiment of the disclosure. Referring to FIG. 4, a schematic flowchart of an embodiment of an electronic device provided by an embodiment of the disclosure is shown.

Specifically, the electronic device comprises a processor 401 with one or more processing cores, a memory 402 with one or more computer-readable storage media, a power supply 403, an input unit 404, and other components. It can be understood by those skilled in the art that the structure of the electronic device shown in FIG. 4 does not constitute a limitation on the electronic device, and may include more or less components than those illustrated, or combine certain components, or arrange different components.

The processor 401 is a control center of the electronic device, and connects the various parts of the entire electronic device by various interfaces and wires. By running or executing the software programs and/or modules stored in the memory 402, and applying the data stored in the memory 402, various functions and data processing of the electronic device are executed. Therefore, the electronic device is overall monitored. Optionally, the processor 401 comprises one or more processing cores. Preferably, an application processor and a modem processor are integrated into the processor 401. The application processor mainly processes an operating system, a user interface, and application programs, etc. The modem processor mainly processes wireless communication. It can be understood that the modem processor may not be integrated into the processor 401.

The memory 402 is configured to store software programs and modules, and the processor 401 executes various functional applications and data processing by running the software programs and modules stored in the memory 402. The memory 402 mainly includes a storage program area and a storage data area. The storage program area stores an operating system and application programs required by at least one function (such as a sound playback function, an image playback function, etc.), etc. The storage data area stores data created according to the operation of electronic devices and the like. In addition, the memory 402 comprises a high-speed random access memory, and also comprises a non-volatile memory, such as at least one magnetic disk storage device, a flash memory device, or other volatile solid-state storage devices. Accordingly, the memory 402 further comprises a memory controller to provide the processor 401 access to the memory 402.

The electronic device further includes a power supply 403 that supplies power to various components. Preferably, the power supply 403 can be logically connected to the processor 401 through a power management system, so that functions such as charging, discharging, and power consumption management can be implemented through the power management system. The power supply 403 also includes any component such as one or more DC or AC power supplies, a recharging system, a power failure detection circuit, a power converter or inverter, and a power status indicator.

The electronic device further includes an input unit 404, which is configured to receive inputted numeric or character information, and generate keyboard, mouse, joystick, optical, or trackball signal inputs related to user installation and function control.

Although it is not shown, the electronic device further includes a display unit and the like, which will not be repeated here. Specifically in this embodiment, the processor 401 in the electronic device loads the executable file corresponding to the process of one or more application programs into the memory 402 according to the following instructions, and the processor 401 executes and stores the application in memory 402.

The functions of the electronic device comprises:
obtaining output instructions of auxiliary signs in a design drawing of the display panel;
obtaining different types of default auxiliary sign specification parameters;
collecting sign parameters of the auxiliary signs in the design drawing of the display panel according to the auxiliary sign specification parameters; and
outputting the sign parameters of the auxiliary signs in the design drawing of the display panel.

It can be understood by those of ordinary skill in the art that all or part of the steps in the various methods of the above embodiments can be performed by instructions or by controlling related hardware with instructions. The instructions can be stored in a computer-readable storage medium and loaded and executed by a processor.

Accordingly, the embodiment of the disclosure provides a computer-readable storage medium, which include: read only memory (ROM, Read Only Memory), random access memory (RAM, Random Access Memory), magnetic disk, or optical disk, etc. A computer program is stored therein, and the computer program is loaded by the processor to execute the steps in any one of the method for extracting information from the display panel provided by the embodiments of the disclosure. For example, the computer program loaded by the processor may perform the following steps:
obtaining output instructions of auxiliary signs in a design drawing of the display panel;
obtaining different types of default auxiliary sign specification parameters;
collecting sign parameters of the auxiliary signs in the design drawing of the display panel according to the auxiliary sign specification parameters; and
outputting the sign parameters of the auxiliary signs in the design drawing of the display panel.

In the above embodiment, the description of each embodiment has its own emphasis. For the part not detailed in one embodiment, please refer to the detailed description of other embodiments above, and will not be repeated here.

In specific implementation, the above units or structures can be implemented as independent entities, or they can be combined in any combination as one or several entities. For the specific implementation of the above units or structures, please refer to the above embodiments of the method, and will not be repeated here. The specific implementation of the above operations can refer to the previous embodiments, and will not be repeated here.

As mentioned above, the disclosure provides a method for extracting information from a display panel, a device, and an electronic device. In this description, specific embodiments are used to explain the principle and implementation of this disclosure. The descriptions of the above embodiments are only used to help understand the method and core ideas of this disclosure. At the same time, for those skilled in the art, according to the principle of the disclosure, there will be changes in the specific implementation method and application scope. In summary, it is understood that many changes and modifications to the described embodiment can be carried out without departing from the scope and the spirit of the invention that is intended to be limited only by the appended claims.

What is claimed is:
1. A method for extracting information from a design drawing of a display panel, comprising: by an electronic device,
obtaining an instruction to output auxiliary signs in the design drawing; and
in response to the instruction, obtaining a plurality of preset types of auxiliary sign specification parameters, acquiring sign parameters of the auxiliary signs from the design drawing according to the auxiliary sign specification parameters, and outputting the sign parameters,
wherein the auxiliary signs comprise one or more types of auxiliary marks, the auxiliary sign specification parameters comprise a layer position of each of the types of auxiliary marks, a size of each auxiliary mark of each of the types of auxiliary marks, and a shape of each auxiliary mark of each of the types of auxiliary marks, and the sign parameters comprise respective coordinates of the auxiliary marks; and
the acquiring of the sign parameters comprises: for each of the types of auxiliary marks,
taking the each of the types of auxiliary marks as a target type of auxiliary marks, and determining a first target layer where the target type of auxiliary marks are located in the design drawing according to the auxiliary sign specification parameters;
finding the target type of auxiliary marks in the first target layer according to a size of each auxiliary mark of the target type of auxiliary marks and a shape of each auxiliary mark of the target type of auxiliary marks that are indicated in the auxiliary sign specification parameters; and
acquiring a coordinate of each auxiliary mark of the found target type of auxiliary marks.

2. The method according to claim 1, wherein the sign parameters further comprise a value of a distance of each of the auxiliary marks from an edge, and
the acquiring of the sign parameters further comprises: for each of the types of auxiliary marks, acquiring a value of a distance of each auxiliary mark of the found target type of auxiliary marks from the edge.

3. The method according to claim 1, wherein the one or more types of auxiliary marks comprise at least one of a cutting alignment mark, a cutting inspection mark, an exposure alignment mark, or a metal layer positioning mark.

4. The method according to claim 1, wherein the auxiliary signs further comprise one or more types of auxiliary testkeys, the auxiliary sign specification parameters comprise a layer position of each of the types of auxiliary testkeys, a size of each auxiliary testkey of each of the types of auxiliary testkeys, and a shape of each auxiliary testkey of each of the types of auxiliary testkeys, and the sign parameters further comprise respective coordinates of the auxiliary testkeys; and wherein the acquiring of the sign parameters further comprises: for each of the types of auxiliary testkeys,
taking the each of the types of auxiliary testkeys as a target type of auxiliary testkeys, and determining a second target layer where the target type of auxiliary testkeys are located in the design drawing according to the auxiliary sign specification parameters; and
acquiring respective coordinates of the target type of auxiliary testkeys in the second target layer.

5. The method according to claim 1, wherein the display panel is an organic light emitting diode display panel.

6. The method according to claim 1, further comprising:
when the design drawing is updated, acquiring updated sign parameters of the auxiliary signs from the updated design drawing according to the auxiliary sign specification parameters; and
outputting the updated sign parameters.

7. An electronic device, comprising:
one or more processors; and
a memory storing one or more applications executable by the processors to perform operations comprising:
obtaining an instruction to output auxiliary signs in a design drawing of a display panel; and
in response to the instruction, obtaining a plurality of preset types of auxiliary sign specification parameters, acquiring sign parameters of the auxiliary signs from the design drawing according to the auxiliary sign specification parameters, and outputting the sign parameters,
wherein the auxiliary signs comprise one or more types of auxiliary marks, the auxiliary sign specification parameters comprise a layer position of each of the types of auxiliary marks, a size of each auxiliary mark of each of the types of auxiliary marks, and a shape of each auxiliary mark of each of the types of auxiliary marks, and the sign parameters comprise respective coordinates of the auxiliary marks; and
the acquiring of the sign parameters comprises: for each of the types of auxiliary marks,
taking the each of the types of auxiliary marks as a target type of auxiliary marks, and determining a first target layer where the target type of auxiliary marks are located in the design drawing according to the auxiliary sign specification parameters;
finding the target type of auxiliary marks in the first target layer according to a size of each auxiliary mark of the target type of auxiliary marks and a shape of each auxiliary mark of the target type of auxiliary marks that are indicated in the auxiliary sign specification parameters; and acquiring a coordinate of each auxiliary mark of the found target type of auxiliary marks.

8. The electronic device according to claim 7, wherein the sign parameters further comprise a value of a distance of each of the auxiliary marks from an edge, and
the acquiring of the sign parameters further comprises: for each of the types of auxiliary marks,
acquiring a value of a distance of each auxiliary mark of the found target type of auxiliary marks from the edge.

9. The electronic device according to claim 7, wherein the one or more types of auxiliary marks comprise at least one of a cutting alignment mark, a cutting inspection mark, an exposure alignment mark, or a metal layer positioning mark.

10. The electronic device according to claim 7, wherein the auxiliary signs further comprise one or more types of auxiliary testkeys, the auxiliary sign specification parameters comprise a layer position of each of the types of auxiliary testkeys, a size of each auxiliary testkey of each of the types of auxiliary testkeys, and a shape of each auxiliary testkey of each of the types of auxiliary testkeys, and the sign parameters further comprise respective coordinates of the auxiliary testkeys; and wherein the acquiring of the sign parameters further comprises: for each of the types of auxiliary testkeys,
taking the each of the types of auxiliary testkeys as a target type of auxiliary testkeys, and determining a second target layer where the target type of auxiliary testkeys are located in the design drawing according to the auxiliary sign specification parameters; and
acquiring respective coordinates of the target type of auxiliary testkeys in the second target layer.

11. The electronic device according to claim 7, wherein the display panel is an organic light emitting diode display panel.

12. The electronic device according to claim 7, wherein the operations further comprise:
when the design drawing is updated, acquiring updated sign parameters of the auxiliary signs from the updated design drawing according to the auxiliary sign specification parameters; and
outputting the updated sign parameters.

13. A non-transitory computer-readable storage medium, storing one or more applications executable by one or more processors to perform operations comprising:
obtaining an instruction to output auxiliary signs in a design drawing of a display panel; and
in response to the instruction, obtaining a plurality of preset types of auxiliary sign specification parameters, acquiring sign parameters of the auxiliary signs from the design drawing according to the auxiliary sign specification parameters, and outputting the sign parameters,
wherein the auxiliary signs comprise one or more types of auxiliary marks, the auxiliary sign specification parameters comprise a layer position of each of the types of auxiliary marks, a size of each auxiliary mark of each of the types of auxiliary marks, and a shape of each auxiliary mark of each of the types of auxiliary marks, and the sign parameters comprise respective coordinates of the auxiliary marks; and
the acquiring of the sign parameters comprises: for each of the types of auxiliary marks,
taking the each of the types of auxiliary marks as a target type of auxiliary marks, and determining a first target layer where the target type of auxiliary marks are located in the design drawing according to the auxiliary sign specification parameters;

finding the target type of auxiliary marks in the first target layer according to a size of each auxiliary mark of the target type of auxiliary marks and a shape of each auxiliary mark of the target type of auxiliary marks that are indicated in the auxiliary sign specification parameters; and acquiring a coordinate of each auxiliary mark of the found target type of auxiliary marks.

14. The storage medium according to claim 13, wherein the sign parameters further comprise a value of a distance of each of the auxiliary marks from an edge, and the acquiring of the sign parameters further comprises: for each of the types of auxiliary marks, acquiring a value of a distance of each auxiliary mark of the found target type of auxiliary marks from the edge.

15. The storage medium according to claim 13, wherein the one or more types of auxiliary marks comprise at least one of a cutting alignment mark, a cutting inspection mark, an exposure alignment mark, or a metal layer positioning mark.

16. The storage medium according to claim 13, wherein the auxiliary signs further comprise one or more types of auxiliary testkeys, the auxiliary sign specification parameters comprise a layer position of each of the types of auxiliary testkeys, a size of each auxiliary testkey of each of the types of auxiliary testkeys, and a shape of each auxiliary testkey of each of the types of auxiliary testkeys, and the sign parameters further comprise respective coordinates of the auxiliary testkeys; and wherein the acquiring of the sign parameters further comprises: for each of the types of auxiliary testkeys, taking the each of the types of auxiliary testkeys as a target type of auxiliary testkeys, and determining a second target layer where the target type of auxiliary testkeys are located in the design drawing according to the auxiliary sign specification parameters; and acquiring respective coordinates of the target type of auxiliary testkeys in the second target layer.

17. The storage medium according to claim 13, wherein the display panel is an organic light emitting diode display panel.

18. The storage medium according to claim 13, wherein the operations further comprise:

when the design drawing is updated, acquiring updated sign parameters of the auxiliary signs from the updated design drawing according to the auxiliary sign specification parameters; and outputting the updated sign parameters.

* * * * *